US007690108B2

(12) United States Patent
Tersigni

(10) Patent No.: US 7,690,108 B2
(45) Date of Patent: Apr. 6, 2010

(54) SELF-COMPENSATING CONNECTOR SUPPORT METHOD AND APPARATUS

(75) Inventor: James Edward Tersigni, Highland, NY (US)

(73) Assignee: International Business Machines Corporation, Armonk, NY (US)

( * ) Notice: Subject to any disclaimer, the term of this patent is extended or adjusted under 35 U.S.C. 154(b) by 18 days.

(21) Appl. No.: 12/196,560

(22) Filed: Aug. 22, 2008

(65) Prior Publication Data

US 2010/0043216 A1 Feb. 25, 2010

(51) Int. Cl.

*H05K 3/30* (2006.01)
*H05K 3/36* (2006.01)
*H01K 3/10* (2006.01)
*H01R 12/04* (2006.01)
*H05K 1/11* (2006.01)

(52) U.S. Cl. ............................ 29/832; 29/830; 29/852; 174/261

(58) Field of Classification Search .................. 29/830, 29/832, 852; 174/250

See application file for complete search history.

(56) References Cited

U.S. PATENT DOCUMENTS 3,363,218 A * 1/1968 Breivogel ................... 439/384
5,318,455 A * 6/1994 Villiers et al. ............... 439/248
6,155,856 A * 12/2000 Sanada ....................... 439/246
6,346,007 B2 * 2/2002 Yokoi ......................... 439/564
6,592,387 B2 * 7/2003 Komenda et al. ........... 439/247
7,014,486 B1 * 3/2006 Wu et al. .................... 439/248
7,083,453 B2 * 8/2006 Herring et al. ............. 439/247
7,121,857 B1 * 10/2006 Lewis ......................... 439/247
7,175,443 B2 * 2/2007 Mizuno et al. ............. 439/76.1
7,258,560 B2 * 8/2007 Scafidi et al. ............... 439/248

* cited by examiner

*Primary Examiner*—A. Dexter Tugbang
*Assistant Examiner*—Dadid P Angwin
(74) *Attorney, Agent, or Firm*—Patent Analysis Research Tech. Sys. LLC; George L. Walton

(57) ABSTRACT

A unique self-compensating structure mounted to a printed circuit board (PCB) includes a compensating block element having a back portion with at least a first guide surface and a front portion with at least a third guide surface. A mechanical support member having at least a second guide surface with at least a guide element disposed thereon for sliding engagement with the at least a first guide surface. At least a complaint member cooperatively positioned between a surface on the compensating block element and the at least a third guide surface on the mechanical support member. The at least a third guide surface being cooperatively and movably associated along a back portion of an electrical socket connector via the at least a complaint member for compensating and absorbing external stress and strain of a plug-in connector during alternating plugging and unplugging of the plug-in connector from the socket connector, while simultaneously mitigating damage to the PCB.

1 Claim, 3 Drawing Sheets

SELF-COMPENSATING CONNECTOR SUPPORT METHOD AND APPARATUS

BACKGROUND OF THE INVENTION

1. Field of the Invention

The present invention relates to the field of electrical connectors, more specifically to an electrical plug-in connector that is plugged in or removed from a socket connector that is connected to a printed circuit board by electrical soldering joints.

2. Description of the Related Art

The electrical plug-in connector providing for the input and output of one or both an electrical power and electrical signals to a separate device has long been well known and which is generally made up of a plug-in connector and a socket connector. This plug-in connector is available in various types, which comprises a plurality of terminal sheaths and the socket connector having a corresponding number of connector terminals which are connected to a printed circuit board by means of soldering and which are, when the plug-in connector is plugged into the socket connector, engaged or plugged into the associated terminal sheaths to establish electric circuits between the connector terminals and the terminal sheaths.

In this particular type of the plug-in connector, it is well understood that whenever the plug-in connector is plugged in or removed from the socket connector compressive or tensile load forces act on the printed circuit board and the electrical soldering joints. Where the socket connector is fixed in position with the connector terminals electrically connected directly with the printed circuit board through electrical joints formed by, for example, soldering, repeated application of compressive and tensile load forces to the printed circuit board will eventually result in degradation of the reliability of the printed circuit board and the electrical soldering joints. It is a general practice to mount the plug-in connector and the printed circuit board separately on a housing of an electrical control device in order to secure a highly reliable electrical control device. In this type of structure, the tensile load forces would be generated when the plug-in connector is removed from the socket connector will not be transmitted to the printed circuit board. However, the difference between the coefficient of thermal expansion of a material for the connector terminals in the socket connector and that of a material for the circuit board is apt to allow thermal stresses to develop at the solder joints. When this happens, damage is likely to result in at least one or possibly all of the solder joints.

The other known solution is to rigidly mount a supporting member against the back side of a socket connector to oppose the alternating plugging forces mentioned above. This rigidly mounted method and apparatus is difficult and costly to implement due to manufacturing tolerances, such as mechanical tolerance, connector soldering placement, etc.

In view of the major drawbacks of the above plug-in type connectors, the inventor have made diligent studies and effort to provide a unique, simple, inexpensive and proven effective method and self-compensating structure for mitigating compressive and tensile stresses and strains on a plug-in connector during alternating plugging and removing of the plug-in connector from a socket connector.

SUMMARY OF THE INVENTION

The main object of the present invention is to disclose an electrical control device with a unique self-compensating structure for relieving compressive and tensile stresses and strains on a plug-in connector during alternating plugging and removing of the plug-in connector from a socket connector.

Another object of the present invention is to provide the unique compensating structure with a mechanical support member positioned above or fixedly secured to a printed circuit board in the electrical control device, a unique compensating block element having a first pair of inclined or wedge guide surfaces for sliding along a second pair of complimentary inclined or wedge guide surfaces that includes a guide element on a front portion of the mechanical support member with a third pair of sliding guide surfaces opposite the first pair of inclined or wedge guide surfaces on a front surface of the compensating element that are cooperatively and movably associated along a back portion of an electrical socket connector for compensating and absorbing external stress and strain of a plug-in connector that is a direct result of alternating plugging and removing of the plug-in connector from the socket connector.

The self-compensating structure further provides a pair of compliant members, such as leaf springs, with one end attached to the mechanical support member by a fastening means, such as a screw element, with a screw opening in a top surface thereof, and the other end received in a recess or notch means as shown in FIGS. 1-3. The compliant members permits the compensating block element to slide along the guide elements, the first, second and third pair of guide surfaces relative to the fixed mechanical support member and the back side of the fixed electrical socket connector to reduce the forces applied to the socket connector and the solder joints as various degrees of applied forces are generated from the plug-in connector, while simultaneously mitigating damages thereto. As shown in FIGS. 1-3, of the preferred invention, the mechanical support member of the self-compensating structure supports the back side of the electrical socket connector which alleviates compressive loading problems. However, the mechanical support member of the self-compensating structure can also be positioned on a front portion or side of the socket connector to alleviate tensile loading problems, if desired.

According to the present invention, the pair of sliding compensating block elements are effective to mitigate and absorb the external stresses and strains of a plug-in connector that is a direct result of alternating plugging and removing of the plug-in connector from the socket connector, misalignment of the plug-in connector relative to the socket connector and any possible breakage of the solder joints can be substantially reduced.

The aforementioned objects and advantages of the present invention will be readily clarified in the description of the preferred embodiments and the enclosed drawings of the present invention.

BRIEF DESCRIPTION OF THE DRAWINGS

The present invention may be better understood, and its numerous objects, features, and advantages made apparent to those skilled in the art by referencing the accompanying drawings.

DETAILED DESCRIPTION

Reference will now be made in detail to the preferred embodiment of the invention, examples of which are illustrated in the accompanying drawings. While the invention will be described in conjunction with the accompanying drawings, it will be understood that they are not intended to limit the invention to drawings. On the contrary, the present invention is intended to cover alternatives, modifications and equivalents, which may be included within the spirit and scope of the invention as defined by the appended claim(s).

Figure 1:
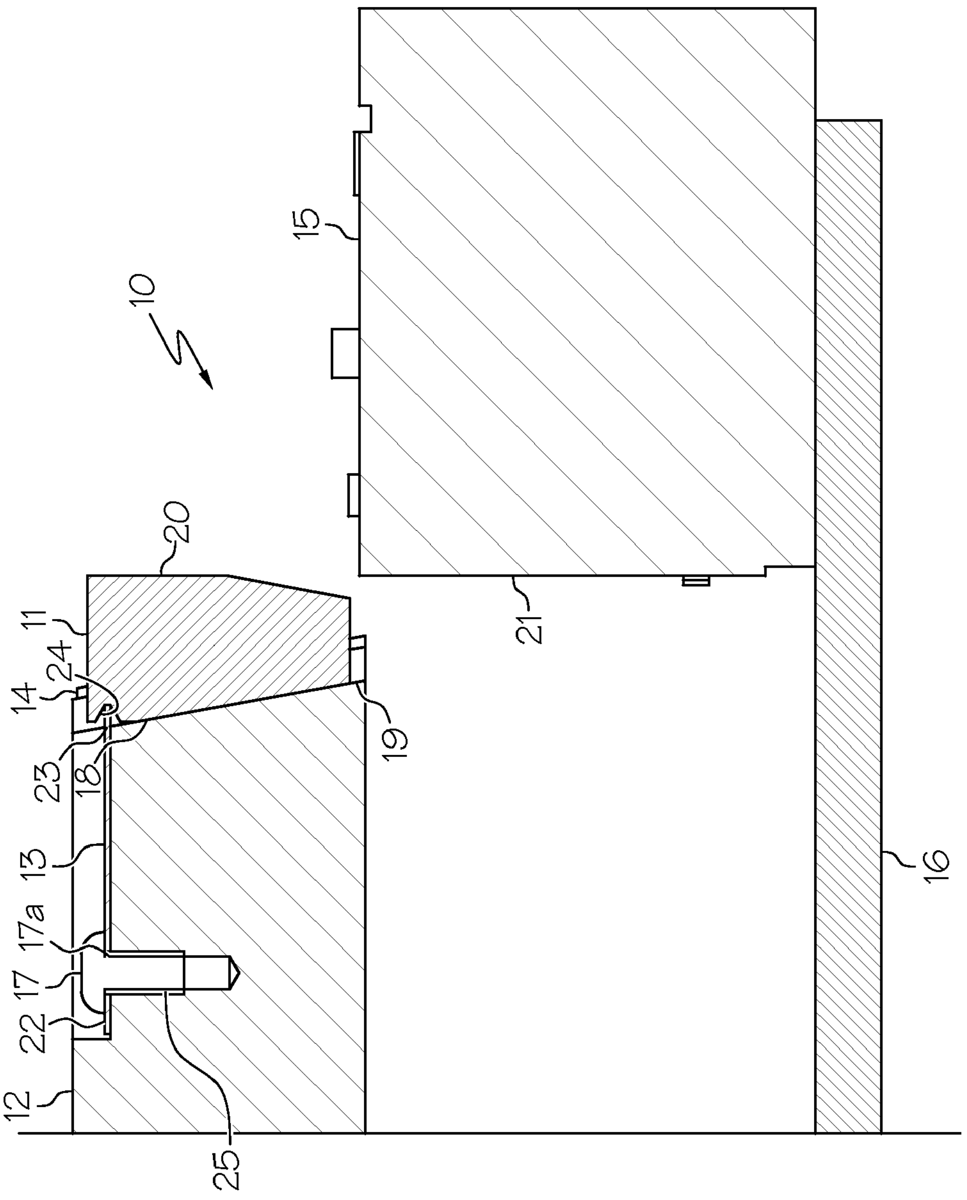
FIG. 1 illustrates a cross-sectional sectional view of a self-compensating external force structure and electrical socket connector cooperatively mounted on a printed circuit board in a non-operational condition according to the present invention.

Having reference now to the drawings, in FIG. 1 there is illustrated a sectional side view of an electrical socket connector and a self-compensating applied force structure generally designated as 10. The self-compensating applied force structure 10 includes at least a compensating block element 11, at least a mechanical support member 12 with a front sliding surface with at least a guide element 14 thereon, at least a complaint member 13 cooperatively positioned between a surface on the at least a compensating block 11 and a surface on the at least a mechanical support member 12, which is positioned at a back side of a socket connector 15 that is cooperatively mounted to a printed circuit board 16 (PCB). The self-compensating structure 10 defines a back side support assembly that is movable relative to the socket connector 15 and the PCB 16 as shown in FIG. 1. Also, the back side support assembly is positioned in a non-operational position as depicted in FIG. 1. Note that the mechanical support member 12 of the self-compensating structure 10 can be positioned on a front side of the socket connector 15 to accommodate tensile forces, if desired.

Figure 2:
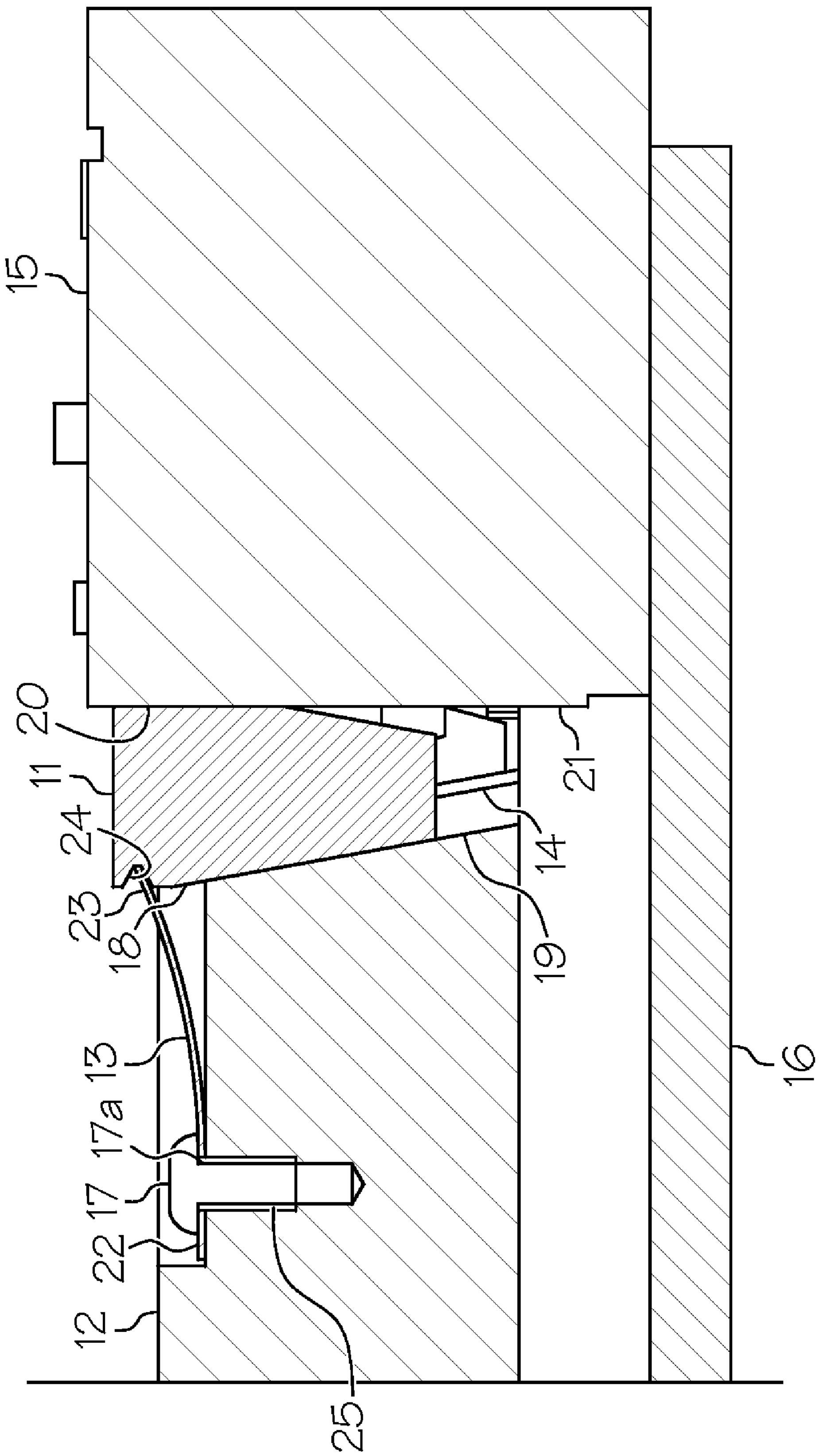
FIG. 2 illustrates a cross-sectional sectional view of the self-compensating external force structure and electrical socket connector cooperatively mounted on a printed circuit board in an operational condition according to the present invention.

As illustrated in FIGS. 1-2, a further description of the self-compensating applied force structure 10 as recited above will now be described in greater details.

The unique compensating block element 11 has a back portion with at least a first inclined or wedge-shaped guide surface 18 for sliding along at least a second complimentary inclined or wedge-shaped guide surface 19 and the at least a guide element 14 being disposed on a front portion of the mechanical support member 12 and at least a third sliding guide surface 20 on a front portion of the compensating block 11 opposite the at least a first inclined or wedge guide surface 18 that is cooperatively and movably associated along a back side surface 21 of the electrical socket connector 15 for compensating and absorbing external stress and strain of a plug-in connector (not shown) that is a direct result of alternating plugging and removing of the plug-in connector from the socket connector 15. Note that the plug-in connector is well known in the art and is therefore not deemed necessary to illustrate to understand the claimed invention. Therefore, the novelty is not in the plug-in connector.

The at least a second wedge-shaped guide surface 19 of the at least a mechanical support member 12 against which the at least a first wedge-shaped guide surface 18 of the at least a compensating block element 11 is seated, is situated in a non-planar fashion relative to the back side surface 21 of the socket connector 15. The at least a first guide surface 18 of the at least a compensating block 11 is planar to and in contact with the at least a second guide surface 19 of the at least a mechanical support member 12, and the at least a third guide surface 20 is approximately planar to the back side portion of the socket connector 15. The at least a compensating block 11 is movable relative to the at least a mechanical support member 12 primarily, but not entirely along the axis of the at least a guide element 14. When the back side support assembly defined by elements 11-14 and 17 is applied to the socket connector 15 and the PCB 16, the at least a third guide surface 20 on the front portion of the at least a compensating block element 11 is in interference with the back side portion of the socket connector 15.

As shown in FIGS. 1-2, the compliant member 13 is defined as a leaf spring, with a first end 22 attached to the at least a mechanical support member 11 by a fastening means 17, such as a screw element, via a leaf spring fastening aperture 17*a* and into at least a screw hole 25 in an upper surface of the at least a mechanical support member 11, and a second end 23 being positioned in a recess or notch 24 on an upper portion of the first guide surface 18 of the compensating block 11 to allow the at least a compliant member 13 to flex upon movement of the compensating block 11.

Figure 3:
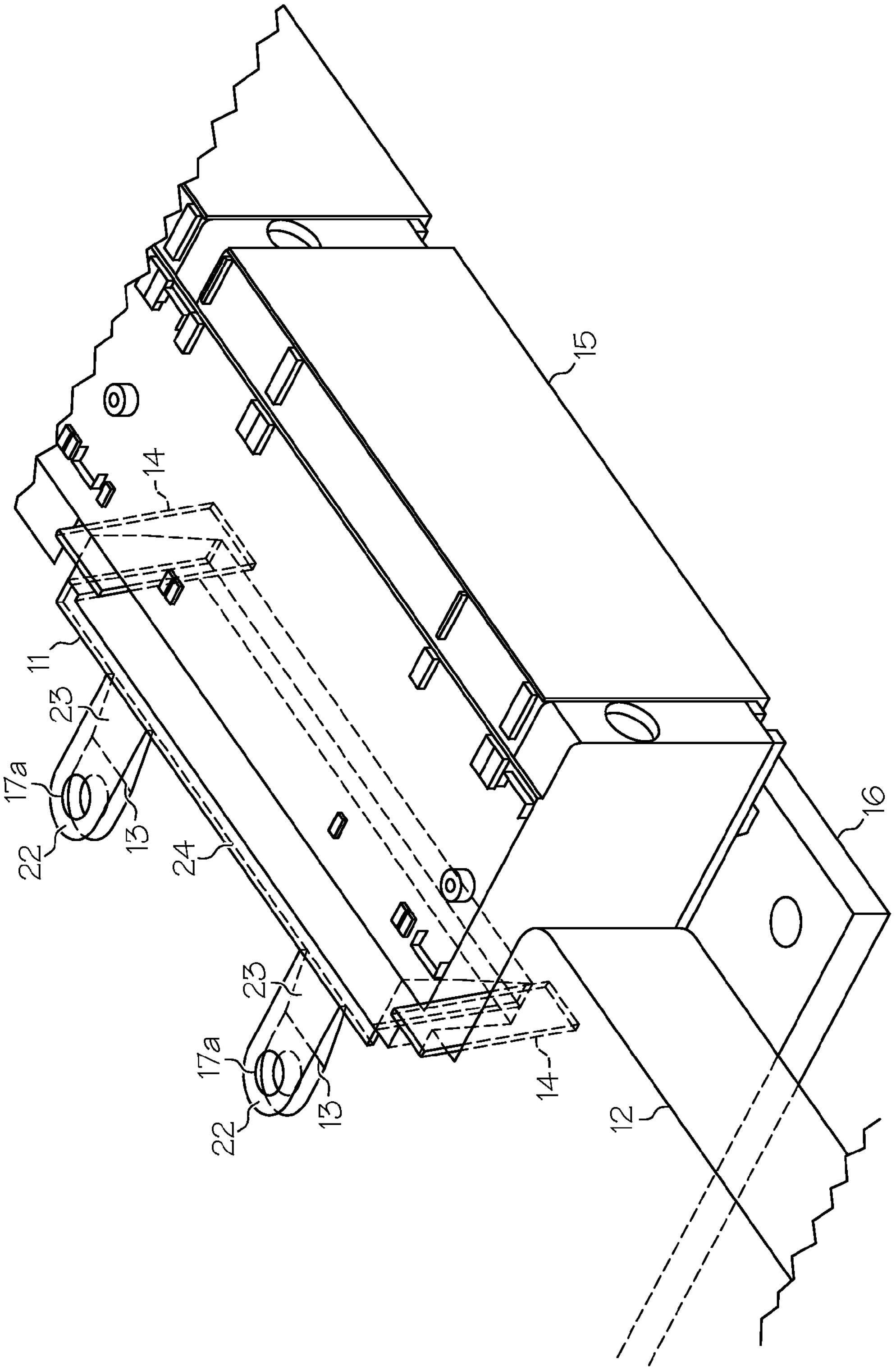
FIG. 3 illustrates a perspective view of a self-compensating external force structure and electrical socket connector that is cooperatively associated with a PCB according to the teachings of the present invention.

FIG. 3 illustrates a compensating block element 11 and a mechanical support member 12 cooperatively associated with at least a pair of first guide surfaces 18, second guide surfaces 19 and third guide surfaces 20, at least a pair of leaf springs 13 with at least a pair of fastening apertures 17*a* at one end thereof, at least a pair of guide elements 14 adjacent the at least a second guide surface, at least a pair of fastening means 17 and at least a pair of screw holes 25, which are optional.

In the discussion hereinafter, the preferred embodiments as illustrated in FIGS. 1-2, will be described in greater details as utilizing at least a compensating block element 11, at least a mechanical support member 12, at least a first guide surface 18, at least a second guide surface 19, at least a third guide surface 20, at least a leaf spring 13 with at least a fastening opening 17*a*, at least a guide elements 14, at least a fastening means 17 to be positioned through the at least a fastening opening 17*a* and into at least a fastening screw opening 25 to achieve the present invention.

As a result of the aforementioned interference, the at least a first guide surface of the compensating block 11 slides along the at least a second guide surface 19 of the mechanical support member 12 being opposed by the at least a leaf springs 13 until the back side support assembly 11-14 and 17 is fully inserted relative to the PCB 16 as depicted in FIG. 2. At this time the compensating block 11 is positioned such that the at least a third guide surface 20 on the front portion thereof are in direct contact with the back side portion 21 of the socket connector 15 and its at least a first guide surface 18 is in contact with the at least a second guide surface 19 of the mechanical support member 12 and it is held in this position by the at least a leaf springs 13. Because the compensating block 11 has a movable range which is greater than the total of the worst case manufacturing tolerances allowed in the back side support assembly. Therefore, the compensating block 11 can provide support to the back side portion 21 of the socket connector 15 in all cases. Due to the non-planar relationship as described above, where the at least a second wedge-shaped guide surface 19 of the mechanical support member 12 against which the at least a first wedge-shaped guide surface 18 of the compensating block element 11 is seated, is situated in a non-planar fashion relative to the back side portion 21 of the socket connector 15, is so slight (such as 10 degrees) the plugging force is always insufficient to displace the compensating block 11.

In operation, the at least a leaf spring 13 permits the at least a first guide surface of the at least a compensating block element 11 to slide along the at least a guide element 14 and the at least a second guide surface 19 of the at least a mechanical support member 12, and the at least a third guide surface 20 on the front portion of the compensating block 11 to slide along the back side portion 21 of the fixed electrical socket connector 15 to reduce the forces applied to the socket connector and the solder joints when alternating applied forces are generated by the plugging and unplugging of the aforementioned plug-in connector from the socket connector 15, while simultaneously mitigating damage to the solder joints and the PCB 16.

The foregoing descriptions of the specific embodiments of FIGS. 1-3 have been presented for purposes of illustration and description. They are not intended to be exhaustive or to limit the present invention to the precise forms disclosed, and obviously many modifications and variations are possible in the light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined as set forth in the following claim(s).

What is claimed is:

1. A method for compensating and relieving stress and strain to a printed circuit board (PCB) and its soldering joints upon applied forces being generated from plugging and unplugging of a plug-in connector, the method comprising:

providing a printed circuit board (PCB);

providing a socket connector mounted to the PCB;

providing a back side support assembly, the back side support assembly includes at least a compensating block element, at least a mechanical support member, at least a compliant member with at least a fastening aperture at one end thereof, at least a fastening element, at least a fastening recess in an upper portion of the at least a compensating block element, at least a fastening hole disposed in a top portion of the at least a mechanical support member and at least a guide element disposed on the mechanical support member;

providing the at least a compensating block with a back portion having at least a first wedge-shaped guide surface and a front portion having at least a third guide surface opposite the at least a first guide surface, the at least a fastening recess being disposed in the at least a first guide surface;

providing the at least a mechanical support member with a front portion having at least a second wedge-shaped guide surface that is in sliding relationship to the at least a first guide surface, the at least a guide element being positioned along the at least a second guide surface;

attaching a first end of the at least a compliant member to the top portion of the at least a mechanical support member with the at least a fastening element inserted into the at least a fastening hole via the at least a fastening aperture, a second end of the at least a complaint member being removably secured in the at least a fastening recess of the at least a first guide surface; and positioning and mounting the back side support assembly relative to the PCB so that the at least a third guide surface is in a sliding interference with the back side portion of the socket connector, wherein the at least a complaint member permits the at least a first guide surface of the at least a compensating block element to slide along the at least a guide element of the at least a second guide surface of the at least a mechanical support member and the at least a third guide surface on the front portion of the at least a compensating block to slide along the back side portion of the socket connector, as a result of the flexing movement of the at least a compliant member, to reduce the forces applied to the socket connector and the PCB when alternating applied forces are generated by the plugging and unplugging of the aforementioned plug-in connector from the socket connector, while simultaneously mitigating damage to the PCB and its soldering joints.

* * * * *